United States Patent [19]
Veselaski et al.

[11] Patent Number: 5,709,026
[45] Date of Patent: Jan. 20, 1998

[54] APPARATUS FOR METAL STAMPING INSERTION INTO A MOLD CAVITY

[75] Inventors: Steve Veselaski, Bay Shore; Curt Delanoy, Massapequa, both of N.Y.

[73] Assignee: Micro Contacts, Inc., Hicksville, N.Y.

[21] Appl. No.: 577,149

[22] Filed: Dec. 22, 1995

[51] Int. Cl.$^6$ ............................................. B23P 21/00
[52] U.S. Cl. .......................... 29/771; 29/566.2; 425/121
[58] Field of Search ........................ 29/771, 775, 566.2; 221/25, 26; 425/121, 123

[56] References Cited

U.S. PATENT DOCUMENTS

| | | | |
|---|---|---|---|
| 4,573,262 | 3/1986 | Domes et al. | 29/771 |
| 4,642,872 | 2/1987 | Grabbe et al. | 29/566.2 |
| 5,241,744 | 9/1993 | Legrady et al. | 29/566.2 |
| 5,395,573 | 3/1995 | Taguchi | 425/121 |

FOREIGN PATENT DOCUMENTS

61-83102  4/1986  Japan ................................. 425/123

*Primary Examiner*—P. W. Echols
*Attorney, Agent, or Firm*—Jay H. Maioli

[57] ABSTRACT

An apparatus for inserting preformed miniature precision metal stampings into a mold cavity for a subsequent plastic molding operation includes close tolerance positioning pins that accurately locate a die head assembly by fitting into respective holes in the mold base and pneumatic and electric motors for moving the die head vertically and horizontally, as well as forward and backward relative to the mold base. The metal stampings are preformed on a metal strip that is indexed in the insertion head by a pneumatically driven pilot pin and then pneumatic cylinders operate cutoff punches that detach the stampings from the strips and place them in the mold cavity. The entire insertion head assembly is permitted a small amount of movement necessary to align the positioning pins in the mold base holes by the provision of ball bearing mounting assemblies used to attach the insertion head apparatus to the base plate of the machine.

22 Claims, 8 Drawing Sheets

APPARATUS FOR METAL STAMPING INSERTION INTO A MOLD CAVITY

BACKGROUND OF THE INVENTION

Field of the Invention

The present invention relates generally to an apparatus for inserting metal stampings into a mold prior to subsequent operations and, more particularly, to an automated apparatus for accurately inserting precision miniature stampings into a mold cavity prior to a subsequent molding operation.

DESCRIPTION OF THE BACKGROUND

There are numerous instances in which metal parts are inserted into a mold cavity prior to subsequently molding those parts into a plastic or resin body using the mold cavity. Typically, in the case of precision stampings forming contacts in a miniature switch, sensor connector or any miniature metal/plastic assembly, the stampings are frequently inserted by hand into the mold cavity as it is arranged on a conveyor belt or rotary work table or the like. Such hand placement is required due to the extremely small size of the stampings being inserted into the mold cavity and also due to the requirement for highly accurate placement of these stampings in the mold cavity.

On the other hand, the manual placement of the contacts, while providing accuracy, is slower than desired in view of modern automation techniques and the requirement to produce large quantities at competitive pricing of the resultant end products.

Generally, in prior attempts to automate this process by either bowl feeding techniques or robotics it was found that in the first instance the parts were typically too small or too fragile to be accurately dealt with or it was not accurate enough concerning the required location for the stampings in the mold cavity and, in the second instance, such attempts were not sufficient in speed to meet the output requirements.

OBJECTS AND SUMMARY OF THE INVENTION

Accordingly, it is an object of the present invention to provide an apparatus for automatically inserting precision metal stampings into a mold cavity that can eliminate the above-noted problems inherent in the previously proposed systems.

Another object of this invention is to provide an apparatus for inserting precision metal stampings into a mold cavity that can perform at a speed faster than the combined cycle of the time of molding and the mechanism delivering the mold cavities to the automatic insertion location.

A further object of this invention is to provide an automated apparatus for inserting stampings into a mold cavity wherein the stampings are originally in the form of a pre-formed strip that is automatically fed into the apparatus and whereby the stampings are automatically severed from the strip and inserted into the mold cavity at the correct locations.

In accordance with an aspect of the present invention, a stamping insertion head is provided that operates both electrically and pneumatically in conjunction with a pre-formed strip bearing stampings so that the stampings are automatically severed from the strip and inserted into a mold cavity which resides on either a rotary table or a shuttle-type table prior to an operation of molding a plastic switch, sensor, or connector using the mold cavity. The insertion head is mounted on a so-called X-Y-Z coordinate table that has three degrees of freedom so that it may move both horizontally and vertically relative to the mold cavity, as well as forward and backward relative to the mold cavity, a number of which are arranged on a rotary table, for example. Steel pins are provided to accurately locate the insertion head relative to each successive mold cavity, as each mold cavity moves into place for the stamping insertion operation.

The above and other objects, features, and advantages of the present invention will become apparent from the following detailed description of illustrative embodiments thereof to be read in conjunction with the accompanying drawings, in which like reference numerals represent the same or similar elements.

DETAILED DESCRIPTION OF PREFERRED EMBODIMENTS

Figure 1:
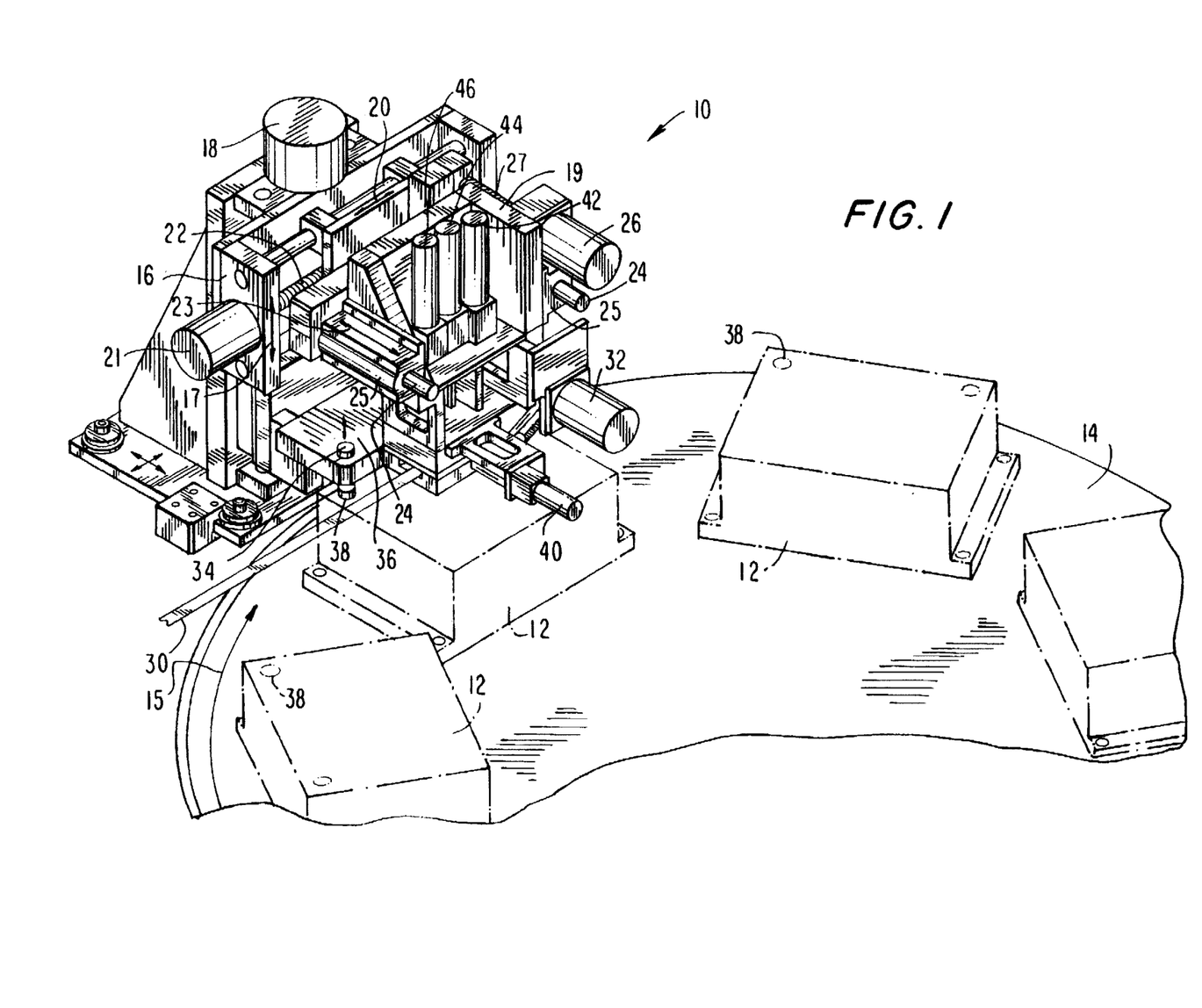
FIG. 1 is an overall perspective view of the insertion head apparatus used in conjunction with a number of mold cavities arranged on a rotary table, according to an embodiment of the present invention.

FIG. 1 shows the inventive insertion head apparatus generally at 10 in relation to a number of mold cavity bases, shown typically at 12. The mold bases 12 are arranged on and bolted to a so-called rotary table 14, which rotates in the direction of arrow 15. Each mold base 12 can typically have four cavities (not shown) and it is into these cavities that the stampings are inserted by the insertion head apparatus 10 prior to a plastic molding operation. In that regard, the rotary table 12 is caused to rotate in the direction shown by the arrow 15, so that the mold base 12 that has had the stampings inserted therein will ultimately be arranged adjacent to the plastic molding head, not shown in FIG. 1, for the resultant molding operation in order to fabricate the switch, sensor, or electrical connector that forms the desired end product.

In the insertion head apparatus 10, a ball slide assembly 16 is provided that can move vertically in the directions shown by arrow 17 under power from an air cylinder 18. The ball slide assembly 16 includes die head assembly 19 that can move laterally, or side to side, in the directions shown by arrow 20 under power from a stepper motor 21 that turns a lead screw 22, all of which will be shown in more detail in the other drawings.

The die head assembly 19 can also move in front to back directions relative to the mold base 12, as represented by arrow 23. This is accomplished by mounting the die head assembly on a pair of shafts 24 that respectively cooperate with a pair of pillow blocks 25. The die head assembly 19 is moved along the shafts 24 by means of a stepper motor 26 and a lead screw or ball screw 27. In this way the die head assembly 19 moves radially relative to the rotary table 14. The stampings that are to be inserted into the mold bases 12 are pre-formed as part of a strip 30 that is drawn through the die head assembly 19 by feed rollers, not shown in FIG. 1, which are driven by a stepper motor 32.

As described above, an object of this invention is to accurately insert the miniature precision stampings into the mold base and this accuracy is ensured according to the embodiment of FIG. 1 by using two steel pilot pins, one of which is shown at 34 in FIG. 1. The steel pilot pins 34 are machined to close tolerances and are firmly affixed to a pilot pin carriage 36. The two pins 34 are mounted on the pilot pin carriage 36, which is moved downwardly so that the pins 34 are inserted into respective pilot holes, shown typically at 38 bored into each of the mold bases 12.

The operations of cutting the stamping from the preformed strip 30 and subsequently inserting the stampings into the mold base 12 are performed by punches and slides and the like that will be described in detail hereinbelow. More specifically, a cutoff slide is driven by an air cylinder 40 and a pilot pin holder used to locate the strip 30 is driven by an air cylinder 42. An air cylinder 44 drives a first punch and a second punch is driven by an air cylinder 46, all of which are mounted on the die head assembly 19.

Figure 2:
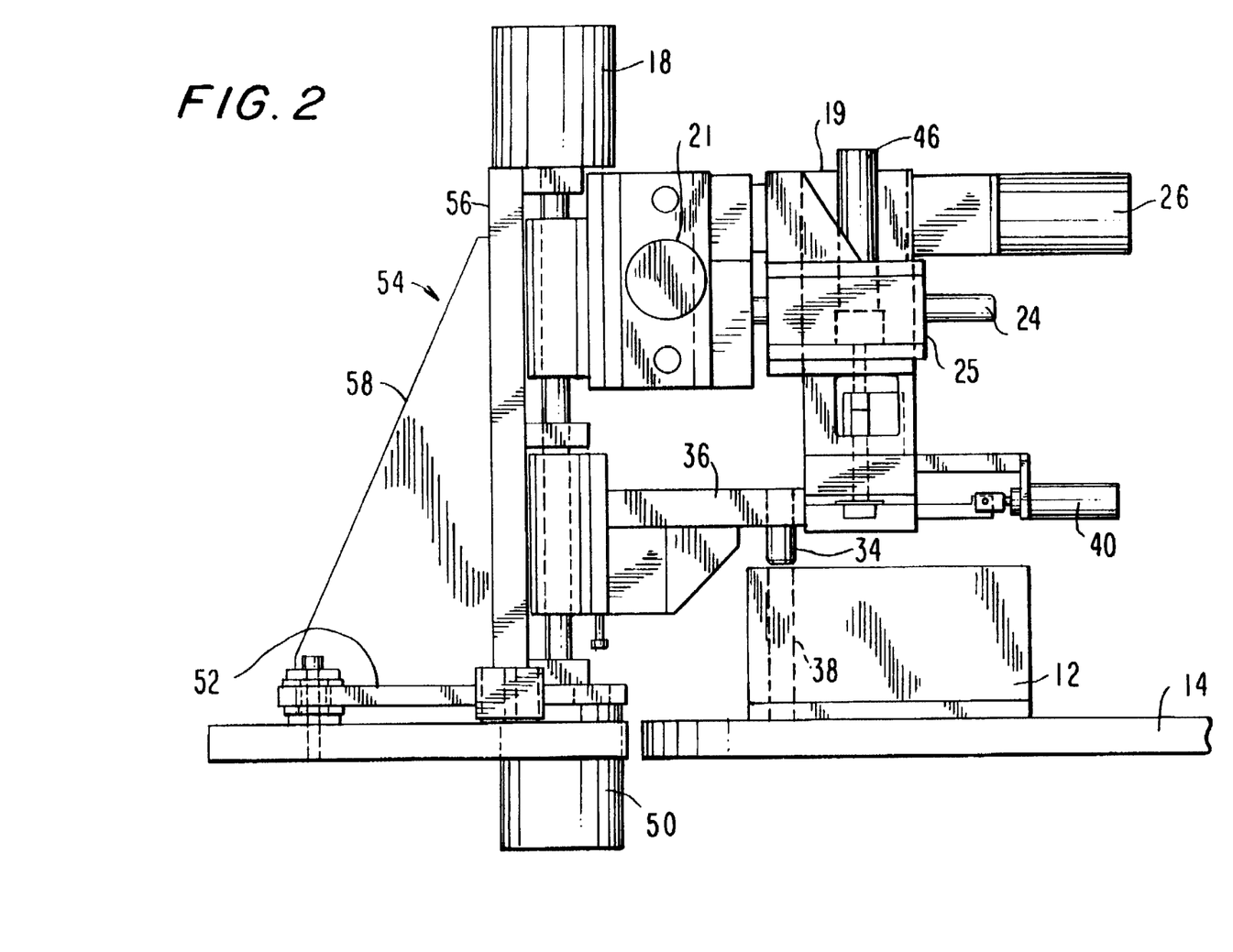
FIG. 2 is a side elevational view of a portion of the apparatus shown in FIG. 1.

FIG. 2 is a side elevational view of the embodiment of FIG. 1 in which, in addition to the air cylinder 18 that drives the ball slide assembly 16 vertically, a further air cylinder 50 is provided that drives the pilot pin carriage 36 so that the pilot pins 34 can be inserted into the holes 38 formed in the mold base 12, thereby accurately locating the die head assembly 19 relative to the mold base 12.

Figure 5:
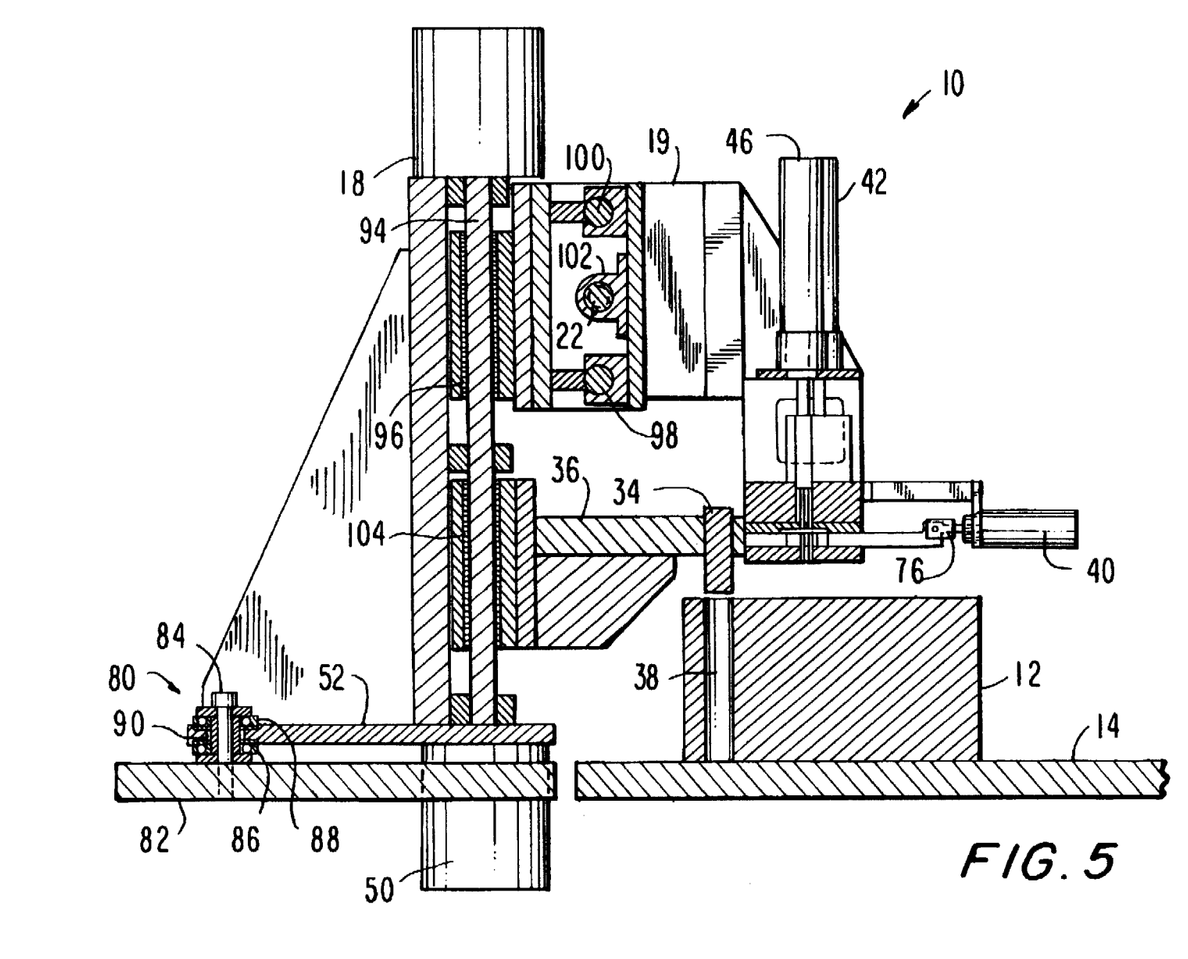
FIG. 5 is a side elevational view in partial cross-section taken through section lines 5—5 in FIG. 4.

In that regard, in order to permit some movement of the insertion head apparatus 10 to obtain proper alignment with each mold base 12, the insertion head apparatus 10 is mounted on a so-called ball bearing plate 52, the details of which will be shown in FIG. 5. The ball bearing plate 52 is part of the overall base structure assembly 54 of the insertion head apparatus 10, and the base structure assembly 54 also includes an upright plate 56 and an angled support plate 58.

Figure 3:
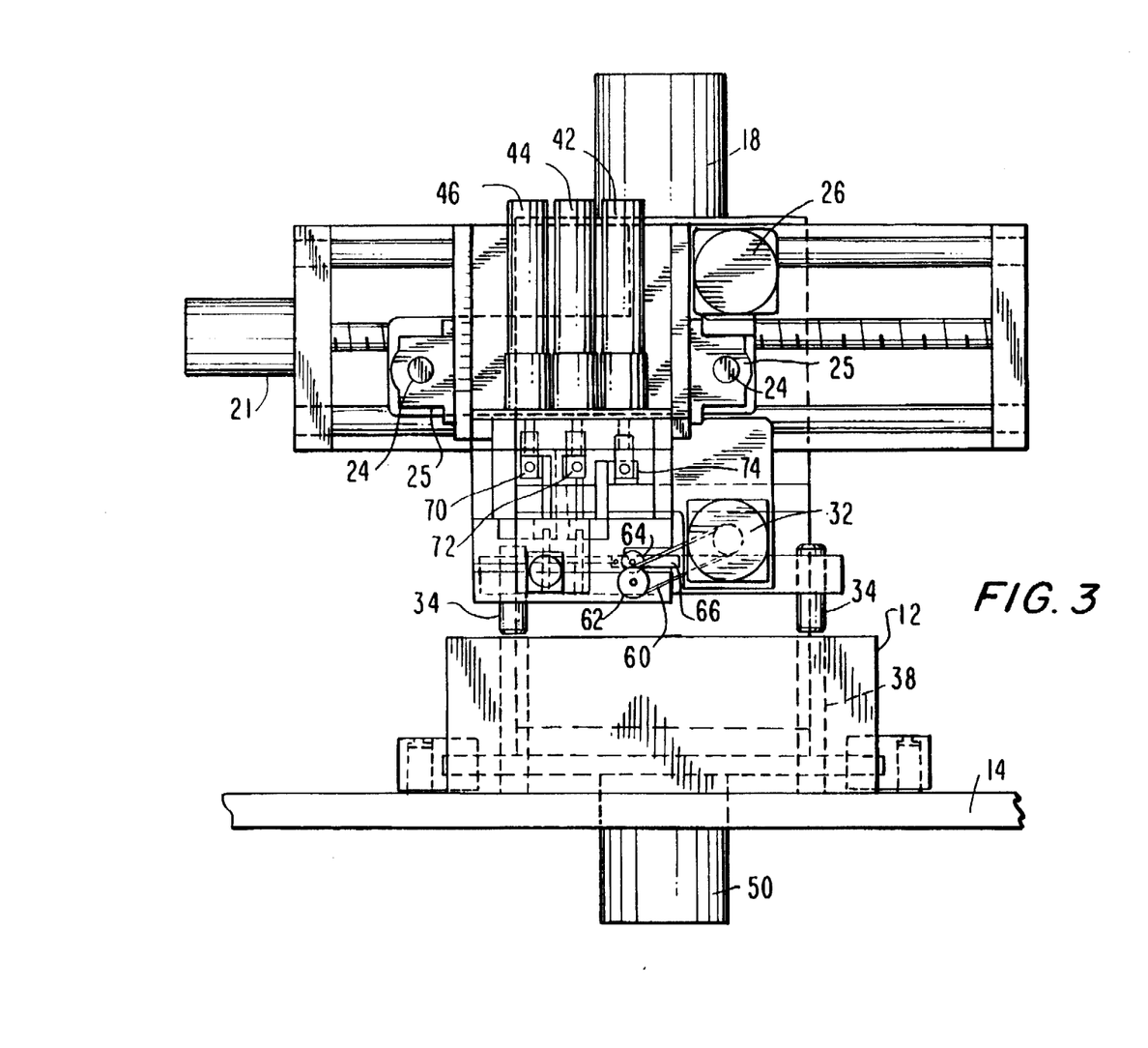
FIG. 3 is a front elevational view of a portion of the apparatus shown in FIG. 1.

As shown in FIG. 3, the stepper motor 32 is connected to drive a belt 60 that is connected to a lower strip feed roller 62. An upper strip feed roller 64 is connected as an idler roller relative to the driven lower feed roller 62, with the strip, not shown in FIG. 3, being stepped accordingly as the stepper motor 32 is driven in accordance with the system shown in FIG. 8. A roller lifter 66 in the form of a bar-type handle is provided to manually raise the upper feed roller 64, so as to remove the strip from the die head assembly 22. The roller lifter 66 is also used to open the feed roller assembly when starting or inserting the strip, not shown in FIG. 3.

Figure 7:
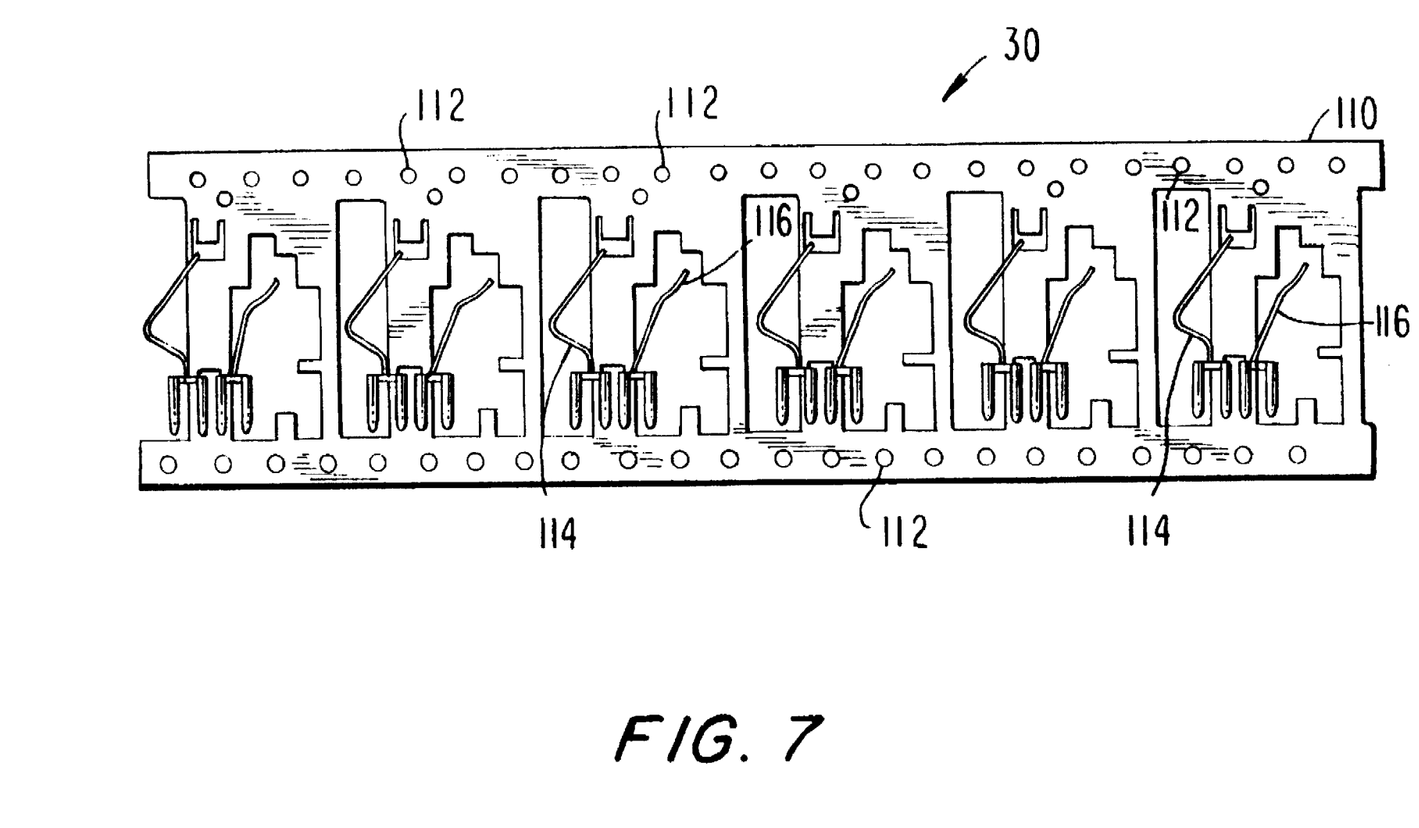
FIG. 7 is an example of a pre-formed strip for use in the embodiment shown in FIG. 1.

The air cylinders 40, 42, 44, and 46 are used in conjunction with the strip 30 having the stampings pre-formed therein. More specifically, air cylinder 46 drives a cut-off punch 70 and air cylinder 44 drives another cut-off punch 72. On the other hand, air cylinder 42 drives a pilot pin holder 74 that serves to accurately locate the pre-formed strip 30 relative to the die head assembly 19, so that the appropriate punching operations can remove the stampings from the strip 30. In that regard, air cylinder 40 drives a cutoff slide 76 shown in FIGS. 2 and 4 that is used as a die cutting edge for the cutting off of the part from the step 30 as shown in FIG. 7. The air cylinder 40 is timed in its operation to retract cutoff slide 76 to the out position before the strip is fed.

Figure 4:
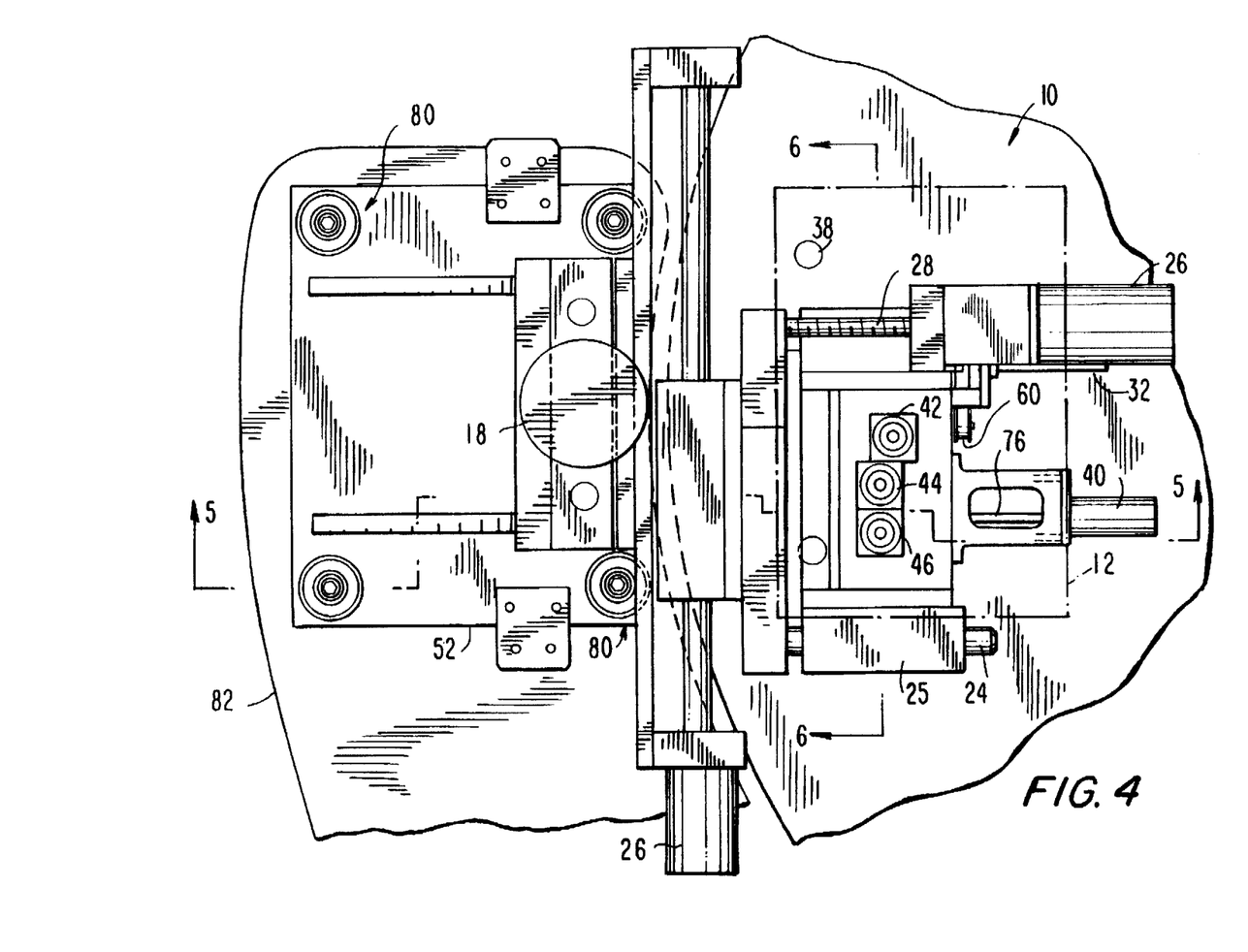
FIG. 4 is a top, plan view of a portion of the apparatus of FIG. 1.

FIG. 4 is a top view of the insertion head apparatus 10 in which the cutoff slide 76 is shown for actuation by the air cylinder 40, and the drive belt 60 is shown driven by the stepper motor 32. In addition, in FIG. 4 the four special ball bearing mounting assemblies, shown typically at 80, are used to mount the ball bearing plate 52 to the overall base plate 82 of the apparatus.

FIG. 5 is an elevational view in partial cross-section taken along section lines 5—5 in FIG. 4 in which the various elements making up the insertion head apparatus 10 are shown in more detail.

Referring then to FIG. 5, which is a side elevational view in partial cross section, the cut-off slide 76 is shown more clearly relative to the die head assembly 19. In addition, the interaction between the steel pilot pin 34 and the pilot pin alignment hole 38 in the mold base 12 is shown more clearly in FIG. 5. The so-called ball bearing plate 52 is attached to the overall base plate 82 of the unit by the ball bearing mounting assemblies 80, which each include a bolt 84 that sandwiches the ball bearing plate 52 between two ball bearing units 86 and 88. These ball bearing units permit some degree of movement for the ball bearing plate 52, thereby permitting the insertion head apparatus 10 to be aligned with the mold base 12 when the two alignment pins 34 are presented to the respective alignment holes 38. There are four separate ball bearing mounting assemblies 80, each consisting of bolt 84 and the two ball bearing units 86 and 88 at each corner of the ball bearing plate 52, as shown in FIG. 4, for example.

The ball bearing plate 52 has four bolts 84 mounting it to the base plate 82, and the through holes 90 that are bored through the ball bearing plate 52 are considerably larger in diameter than the shank of the bolts 84. Thus, these clearance holes 90 permit a rotational movement of the ball bearing plate 52 if such is necessary to align the head assembly 19 with the mold base 12.

The ball slide assembly 16 can move in the vertical direction and the die head assembly 19 can move horizontally relative to the ball slide assembly. In regard to vertical movement of the ball slide assembly 16, the air cylinder 18 causes the ball slide assembly to move along two main shafts 94 in the vertical direction. The ball slide assembly 16 is mounted on the main shafts 94 by linear bearings 96.

On the other hand, the die head assembly 19 can move in the horizontal direction by sliding along two horizontally arranged rails 98 and 100 under control of the stepper motor 21 that rotates the lead screw 22 which is threaded into a nut 102 affixed to the die head assembly 19.

In order to align the die head assembly 19 with a particularly located cavity in the mold base 12, the die head assembly 19 can move forwards and backwards by action of the stepper motor 26 and lead screw 27 moving the die head assembly 19 with the pillow blocks 25 along the horizontal shafts 24.

Similarly, the pilot pin carriage 36 also moves along main shafts 94 under control of the air cylinder 50. The pilot pin carriage 36 is mounted on the main vertical shafts 94 by linear bearings 104. As shown in FIG. 5, the pilot pin carriage 36 has not yet been moved downwardly under control of air cylinder 50, so that pilot pins 34 are not yet engaged with the holes 38 of the mold base 12.

Figure 6:
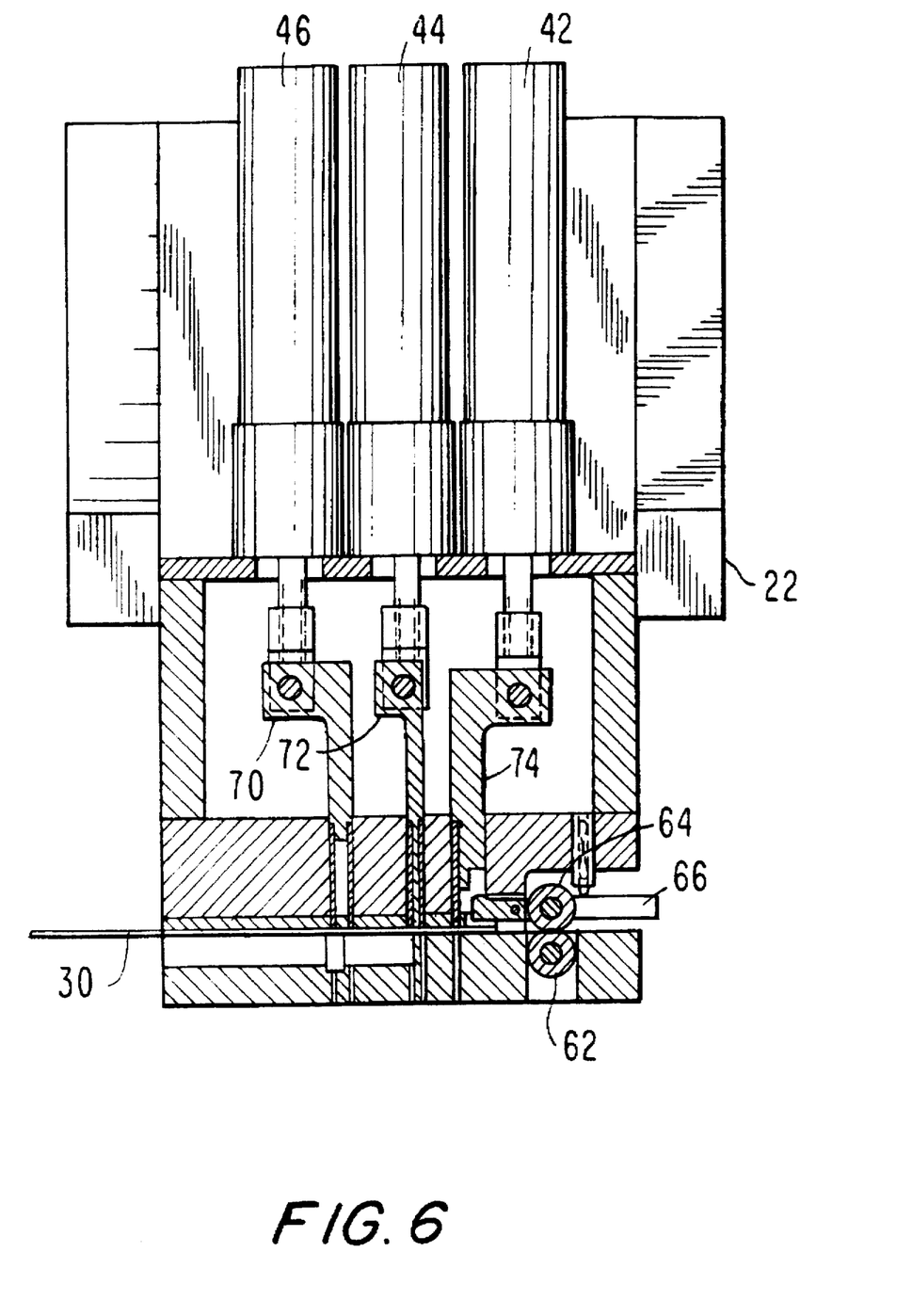
FIG. 6 is a front elevation view in partial cross-section taken through section lines 6—6 in FIG. 4.

FIG. 6 is a closer and more detailed view of the arrangement of the operating elements in the die head assembly 19. More specifically, the air cylinders 42, 44, and 46 are used to operate the various punches and the like, and the cutoff punch 70 is driven by air cylinder 46 to cutoff and insert a precision stamping formed on the strip 30. Similarly, cutoff punch 72 is driven by air cylinder 44 also to cut off another stamping located along the pre-formed strip 30. The pilot pin holder 74 is driven by air cylinder 42 and is used to accurately locate the strip 30 as it is fed through the insertion head. In that regard, as shown in FIG. 6, the pre-formed strip 30 is not yet in contact with the two rubber drive rollers 62 and 64. It is be understood that the strip 30 is inserted and caused to be engaged by the idler roller 64 and the drive roller 62, which is driven by the stepper motor 32. Thus, prior to the cut off and insertion operations performed by cutoff punches 70, 72 and cutoff slide 76, the pilot pin holder 74 is first actuated by air cylinder 42, so that the strip 30 is properly located in the die head assembly 19.

The upper feed roller 64 and the lower feed roller 62 cooperate to progress the strip 30 through the head at precise lengths. The upper feed roller 64 is spring loaded downwardly toward the lower feed roller 62 and applies a constant force against the strip 30 that is trapped between the upper roller 64 and the lower roller 62. The lower feed roller 62 is rotationally driven a precise amount by the stepper motor 32 that is accurately controlled by a logic controller as shown in detail in FIG. 8.

FIG. 7 is a view of the pre-formed strip 30 showing six separate groups of two stamping configurations. The pre-formed strip 30 is a generally flat metal strip 110 that has a plurality of holes formed therein shown typically at 112. These holes are sequentially contacted by the pilot pin holder 74 to accurately locate the strip 110 relative to the die head assembly 19. Each group of stampings is identical and in this embodiment there are two stamping configurations. One such stamping is shown typically at 114 and another at 116. It is understood, of course, that the exact nature of the stampings is not important but, rather, it is the manner in which such stampings are driven or pressed into the mold cavity by the respective punches, such as 70 and 72 in FIG. 6.

Figure 8:
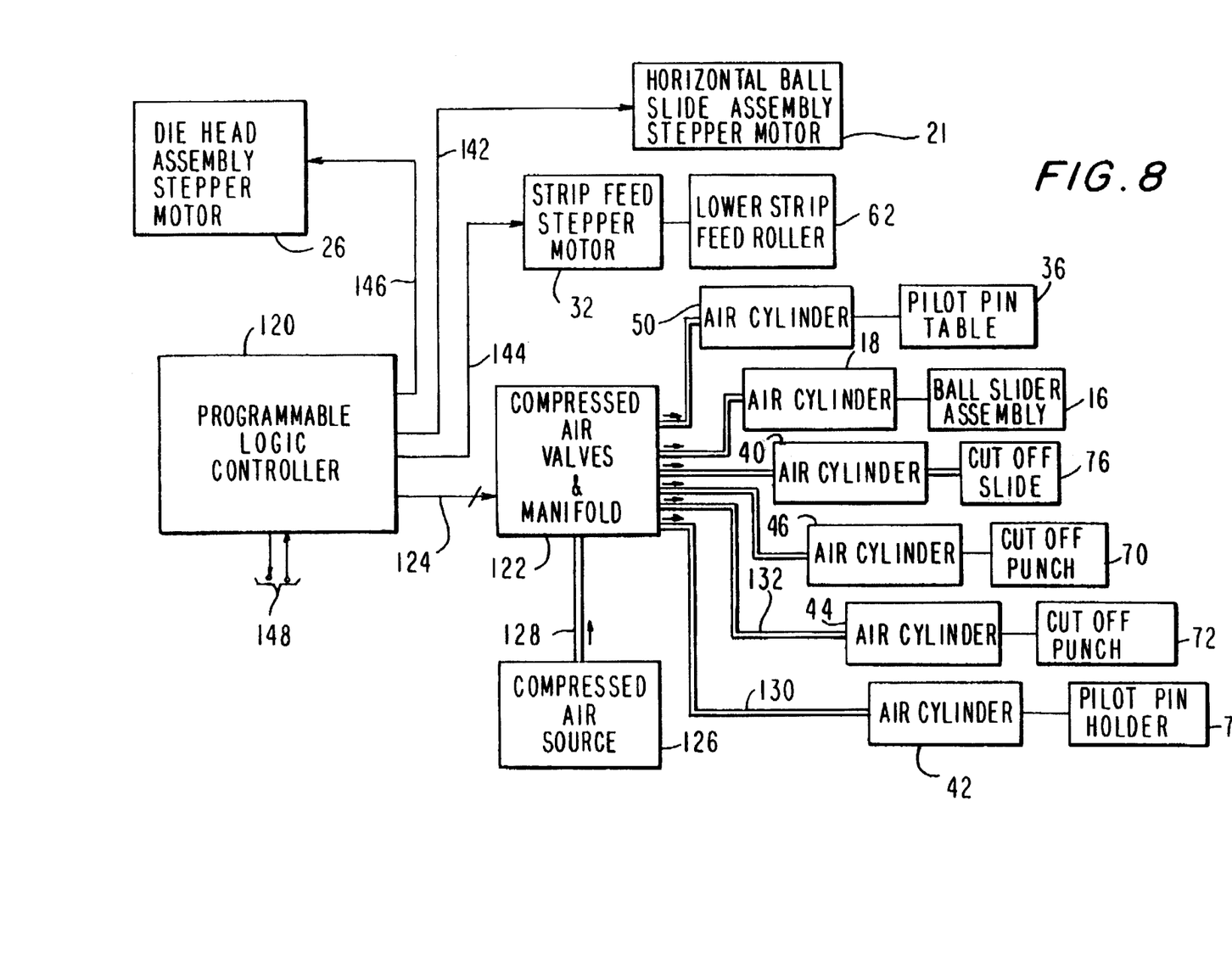
FIG. 8 is an electrical/pneumatic schematic for operating the actuating and adjusting elements used in the embodiment of FIG. 1.

FIG. 8 represents an electrical and pneumatic schematic of the system shown in FIG. 1 in which a programmable logic controller 120, which may comprise a microcomputer or the like, is used to control the overall operations of the mechanical and electrical elements in the system. More particularly, a plurality of compressed air valves and a manifold 122 is connected by a respective plurality of signal lines 124 to the programmable logic controller 120. A source of compressed air 126 provides the appropriate compressed air over pneumatic line 128 to the manifold and valves 122, with such valves being then under control of the programmable logic controller 120. More specifically, the compressed air cylinder 42 is connected by a pneumatic line 130 to control the pilot pin holder 74. The pneumatic cylinder 44 is connected by pneumatic line 132 to control the cutoff punch 72 and the air cylinder 46 is controlled by pneumatic line 134 to control the cutoff punch 70. The horizontal cutoff slide 76 is driven by air cylinder 40 that connected by pneumatic line 136 to valves 122. The ball slide assembly 16 is driven by air cylinder 18 that is controlled by pneumatic line 138, and the pilot pin table 36 is controlled by air cylinder 50 under control of pneumatic line 140.

The three stepper motors are also controlled by the programmable logic controller 120 and, specifically, the horizontal ball slide assembly stepper motor 21 that drives the lead screw 22 is electrically controlled by a signal on line 142 and the strip stepper motor 32 that drives the lower roller 62 for the preformed stamping strip 30 is controlled by line 144. The stepper motor 26 that moves the die head assembly 19 along shafts 24 using lead screw 27 is electrically controlled by a signal on line 146 from the logic controller 120. It is, of course, understood that the motors are connected to the appropriate power sources through conventional wires, not shown.

In addition, because the programmable logic controller 120 must control the various air cylinders and stepper motors in synchronism with the rotation of the rotary table 14, signal lines 148 are provided for communication between the programmable logic controller 120 and the rotary table 14.

Although the present invention has been described hereinabove with reference to the preferred embodiments, it is to be understood that the invention is not limited to such illustrative embodiments alone, and various modifications may be contrived without departing from the spirit or essential characteristics thereof, which are to be determined solely from the appended claims.

What is claimed is:

1. Apparatus for inserting precision metal stampings into a mold base, comprising:

a base structure;

a ball slide assembly movably attached to said base structure;

means for moving said ball slide assembly in a horizontal direction and a vertical direction relative to said base structure;

a pilot pin carriage movably mounted on said base structure and having plurality of positioning pins for insertion into respective positioning holes formed in the mold base;

means for moving said pilot pin carriage in a vertical direction so that said positioning pins engage the positioning holes in the mold base;

a die head assembly movably mounted on said ball slide assembly and including means for receiving and advancing a strip bearing a plurality of metal stampings, means for indexing the strip to a predetermined position, means for cutting off a metal stamping from the strip and inserting the cutoff metal stamping into a cavity formed in the mold base, and actuation means for actuating said means for indexing and said means for cutting off;

means for moving said die head assembly relative to the mold base; and control means for controlling said means for moving said ball slide assembly, said means for moving said pilot pin carriage, said means for moving said die head assembly, said actuation means, and said means for cutting off and inserting the cutoff metal stampings into the cavity in the mold base.

2. The apparatus according to claim 1, wherein said base structure includes:

a base plate; and ball bearing mounting means for attaching said base plate to an immobile surface so that said base plate has freedom of movement relative to the mold base when said positioning pins are engaged in the positioning holes in the mold base.

3. The apparatus according to claim 2, wherein said ball bearing mounting means includes a plurality of ball bearing assemblies, each said ball bearing assembly including two ball bearing units having said base plate sandwiched therebetween and a bolt fastening said two ball bearing units and said base plate to the immobile surface.

4. The apparatus according to claim 3, wherein said ball bearing mounting means comprises four ball bearing assemblies.

5. The apparatus according to claim 1, wherein said ball slide assembly comprises a plurality of horizontal rods having said die head assembly mounted for motion therealong and said means for moving said ball slide assembly comprises a stepper motor driving a lead screw, and said die head assembly is attached to said feed screw by a threaded nut, wherein said stepper motor is controlled by said control means.

6. The apparatus according to claim 5, wherein said base structure includes a vertically arranged main shaft and said ball slide assembly is mounted for vertical movement therealong and said means for moving said ball side assembly includes a pneumatic cylinder attached to said base structure for moving said ball slide assembly relative to said base structure.

7. The apparatus according to claim 6, wherein said pilot pin carriage is mounted for vertical movement on said main shaft and said means for moving said pilot pin carriage comprises a second pneumatic cylinder attached to said base structure for moving said pilot pin carriage along said main shaft, said second pneumatic cylinder being controlled by said control means.

8. The apparatus according to claim 1, wherein said means for indexing includes a pilot pin holder for cooperating with a hole formed in the strip and a pneumatic cylinder for moving said pilot pin holder into engagement with the hole formed in the strip.

9. The apparatus according to claim 1, further comprising a plurality of horizontal shafts attached to said ball slide assembly and a respective plurality of pillow blocks attached to said die head assembly and arranged for sliding movement along said shaft.

10. The apparatus according to claim 9, wherein said means for moving said die head assembly comprises a stepper motor mounted on said die head assembly for rotating a lead screw having one end affixed to said ball slide assembly and having said die head assembly attached thereto for movement therealong.

11. A system for inserting precision metal stampings into a mold cavity formed in a mold base, comprising:

a metal strip having a plurality of stamping elements pre-formed therealong and having a plurality of index holes formed along a length of said strip, a base structure;

a head assembly movably mounted on said base structure for vertical movement and horizontal movement in two directions relative to the mold base arranged on a movable table and for receiving said metal strip and cutting off one of said plurality of stamping elements and inserting the cutoff stamping element into the mold cavity; and control means for controlling movement of said head assembly and for controlling the cutting off and inserting operations of said head assembly based on movement of the moveable table.

12. The system according to claim 11, further comprising a pilot pin carriage movably mounted on said base structure and having a plurality of positioning pins for insertion into respective positioning holes formed in the mold base, and means for moving said pilot pin carriage under control of said control means, so that said positioning pins engage the positioning holes in the mold base.

13. The system according to claim 12, wherein said head assembly includes:

a ball slide assembly movably attached to said base structure;

means for moving said ball slide assembly in a first horizontal direction and a vertical direction relative to said base structure;

a die head assembly movably mounted on said ball slide assembly and including means for receiving and advancing a strip bearing a plurality of the metal stampings;

means for indexing the strip, to a predetermined position;

means for cutting off metal stampings from the strip and inserting cutoff stampings into a cavity formed in the mold base;

actuation means for actuating said means for indexing and said means for cutting off; and means for moving said die head assembly in a second horizontal direction relative to the mold cavity.

14. The apparatus according to claim 13, further comprising a pair of shafts extending from said ball slide assembly and a pair of pillow blocks attached to said die head assembly and cooperating with said pair of shafts, whereby said die head assembly moves horizontally relative to the mold cavity.

15. The apparatus according to claim 14, wherein said means for moving said die head assembly comprises a stepper motor mounted on said die head assembly for rotating a lead screw having one end affixed to said ball slide assembly and having said die head assembly attached thereto for movement therealong.

16. The apparatus according to claim 13, wherein said base structure includes:

a base plate; and ball bearing mounting means for attaching said base plate to an immobile surface so that said base plate has freedom of movement relative to the mold base when said positioning pins are engaged in the positioning holes in the mold base.

17. The apparatus according to claim 16, wherein said ball bearing mounting means includes a plurality of ball bearing assemblies, each said ball bearing assembly including two ball bearing units having said base plate sandwiched therebetween and a bolt fastening said two ball bearing units and said base plate to the immobile surface.

18. The apparatus according to claim 17, wherein said ball bearing mounting means comprises four ball bearing assemblies.

19. The apparatus according to claim 18, wherein said ball slide assembly comprises a plurality of horizontal rods having said die head assembly mounted for motion therealong and said means for moving said ball slide assembly comprises a stepper motor driving a lead screw, and said die head assembly is attached to said feed screw by a threaded nut, wherein said stepper motor is controlled by said control means.

20. The apparatus according to claim 19, wherein said base structure includes a vertically arranged main shaft and said ball slide assembly is mounted for vertical movement therealong and said means for moving said ball side assembly includes a pneumatic cylinder attached to said base structure for moving said ball slide assembly relative to said base structure.

21. The apparatus according to claim 20, wherein said pilot pin carriage is mounted for vertical movement on said main shaft and said means for moving said pilot pin carriage comprises a second pneumatic cylinder attached to said base structure for moving said pilot pin carriage along said main shaft, said second pneumatic cylinder being controlled by said control means.

22. The apparatus according to claim 21, wherein said means for indexing includes a pilot pin holder for cooperating with a hole formed in the strip of metal stampings and a pneumatic cylinder for moving said pilot pin holder into engagement with the hole formed in the strip.

* * * * *